US008274301B2

(12) United States Patent
Feng et al.

(10) Patent No.: US 8,274,301 B2
(45) Date of Patent: Sep. 25, 2012

(54) ON-CHIP ACCELERATED FAILURE INDICATOR

(75) Inventors: Kai D. Feng, Hopewell Junction, NY (US); Thomas J. Fleischman, Hopewell Junction, NY (US); Ping-Chuan Wang, Hopewell Junction, NY (US); Xiaojin Wei, Hopewell Junction, NY (US); Zhijian Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 12/610,683

(22) Filed: Nov. 2, 2009

(65) Prior Publication Data

US 2011/0102005 A1    May 5, 2011

(51) Int. Cl.
*G01R 31/00* (2006.01)
*G01R 31/10* (2006.01)
(52) U.S. Cl. .......... 324/750.03; 324/750.05; 324/750.06
(58) Field of Classification Search .................. None
See application file for complete search history.

(56) References Cited

U.S. PATENT DOCUMENTS

| | | |
|---|---|---|
| 4,093,907 A | 6/1978 | Nutz |
| 4,127,859 A | 11/1978 | Nelson |
| 4,130,787 A | 12/1978 | Allaire et al. |
| 4,254,705 A | 3/1981 | Ishikawa et al. |
| 4,497,998 A | 2/1985 | West |
| 4,683,483 A | 7/1987 | Burnham et al. |
| 4,730,160 A | 3/1988 | Cusack et al. |
| 4,843,445 A | 6/1989 | Stemme |
| 4,899,180 A | 2/1990 | Elhatem et al. |
| 5,163,063 A * | 11/1992 | Yoshikawa et al. ........ 372/38.02 |
| 5,233,161 A | 8/1993 | Farwell et al. |
| 5,294,776 A | 3/1994 | Furuyama |
| 5,369,245 A | 11/1994 | Pickering |
| 5,818,097 A | 10/1998 | Rohlfing et al. |
| 5,883,009 A | 3/1999 | Villa et al. |
| 5,898,706 A | 4/1999 | Dufresne et al. |
| 6,028,331 A | 2/2000 | Mastromatteo et al. |
| 6,046,433 A | 4/2000 | Gross et al. |
| 6,081,280 A | 6/2000 | Bolash et al. |
| 6,326,229 B1 | 12/2001 | Mastromatteo et al. |
| 6,357,131 B1 | 3/2002 | Cheng et al. |
| 6,486,450 B1 | 11/2002 | Quinlan et al. |
| 6,602,729 B2 | 8/2003 | Lin |
| 6,684,353 B1 | 1/2004 | Parker et al. |
| 6,700,910 B1 | 3/2004 | Aoki et al. |
| 6,795,453 B2 | 9/2004 | Pezeshki et al. |
| 6,861,860 B2 * | 3/2005 | Maggi et al. ............. 324/750.05 |
| 7,098,054 B2 | 8/2006 | Filippi et al. |
| 7,117,119 B2 | 10/2006 | Van Dyk et al. |
| 7,133,727 B2 | 11/2006 | Van Dyk et al. |

(Continued)

*Primary Examiner* — Roberto Velez
(74) *Attorney, Agent, or Firm* — Cantor Colburn LLP; Wenji Li

(57) ABSTRACT

An accelerated failure indicator embedded on a semiconductor chip includes an insulating region; a circuit located inside the insulating region; a heating element located inside the insulating region, the heating element configured to heat the circuit to a temperature higher than an operating temperature of the semiconductor chip; and a reliability monitor configured to monitor the circuit for degradation, and further configured to trigger an alarm in the event that the degradation of the circuit exceeds a predetermined threshold. A method of operating an accelerated failure indicator embedded on a semiconductor chip includes determining an operating temperature of the semiconductor chip; heating a circuit located inside an insulating region of the accelerated failure indicator to a temperature higher than the determined operating temperature; monitoring the circuit for degradation; and triggering an alarm in the event that the degradation of the circuit exceeds a predetermined threshold.

20 Claims, 6 Drawing Sheets

U.S. PATENT DOCUMENTS

| | | |
|---|---|---|
| 7,159,100 B2 | 1/2007 | van Hook et al. |
| 7,181,484 B2 | 2/2007 | Stribaek et al. |
| 7,197,625 B1 | 3/2007 | van Hook et al. |
| 7,225,212 B2 | 5/2007 | Stribaek et al. |
| 7,287,177 B2 | 10/2007 | Bonaccio et al. |
| 7,400,292 B2 | 7/2008 | DiLellio |
| 7,484,823 B2 | 2/2009 | Barkley et al. |
| 7,705,619 B2 * | 4/2010 | Kato et al. ............... 324/750.05 |
| 2005/0270049 A1 * | 12/2005 | Kishishita ................. 324/760 |
| 2009/0106712 A1 * | 4/2009 | Bickford et al. ................. 716/4 |

* cited by examiner

600

DETERMINE OPERATING TEMPERATURE OF CRITICAL CIRCUITRY IN CHIP
601

HEAT THERMALLY INSULATED REGION OF AFI TO TEMPERATURE HIGHER THAN DETERMINED OPERATING TEMPERATURE
602

MONITOR CIRCUIT LOCATED IN THERMALLY ISOLATED REGION FOR DEGRADATION
603

TRIGGER ALARM WHEN DEGRADATION EXCEEDS PREDETERMINED THRESHOLD
604

ON-CHIP ACCELERATED FAILURE INDICATOR

BACKGROUND

This disclosure relates generally to the field of semiconductor chip reliability monitoring.

Semiconductor chips are used in a wide variety of industries and applications, such as military equipment or satellites, under diverse operating conditions. The circuitry comprising a semiconductor chip degrades over the lifetime of the semiconductor chip, ultimately resulting in chip failure. Circuit degradation in a semiconductor chip is influenced by the operating conditions of the chip, including voltage bias, current density, and temperature. Circuit degradation may be accelerated by defective chips or abnormal operating conditions, such as power surges or unexpected temperature shifts. Chip failure may cause catastrophic failure of a larger system incorporating the chip. Reliability monitoring of semiconductor chips may prevent unforeseen chip failure, allowing a potentially failing chip to be made redundant or flagged for replacement or repair before catastrophic failure occurs.

SUMMARY

An exemplary embodiment of an accelerated failure indicator embedded on a semiconductor chip includes an insulating region; a circuit located inside the insulating region; a heating element located inside the insulating region, the heating element configured to heat the circuit to a temperature higher than an operating temperature of the semiconductor chip; and a reliability monitor configured to monitor the circuit for degradation, and further configured to trigger an alarm in the event that the degradation of the circuit exceeds a predetermined threshold.

An exemplary embodiment of a method of operating an accelerated failure indicator embedded on a semiconductor chip includes determining an operating temperature of the semiconductor chip; heating a circuit located inside an insulating region of the accelerated failure indicator to a temperature higher than the determined operating temperature; monitoring the circuit for degradation; and triggering an alarm in the event that the degradation of the circuit exceeds a predetermined threshold.

An exemplary embodiment of an electronics package comprising a semiconductor chip comprising an accelerated failure indicator includes a heat spreader, the heat spreader being connected to the semiconductor chip via a heat conducting compound; and a gap in the heat conducting compound located in an area corresponding to a location of the accelerated failure indicator on the semiconductor chip, wherein the accelerated failure indicator comprises: an insulating region; a circuit located inside the insulating region; a heating element located inside the insulating region, the heating element configured to heat the circuit to a temperature higher than an operating temperature of the semiconductor chip; and a reliability monitor configured to monitor the circuit for degradation, and further configured to trigger an alarm in the event that the degradation of the circuit exceeds a predetermined threshold.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for an on-chip accelerated failure indicator (AFI) are provided, with exemplary embodiments being discussed below in detail. The AFI may be embedded in the semiconductor chip, and may act as a reliability monitor for the chip. Applying a stress condition comprising an elevated temperature to a circuit located in the AFI accelerates degradation of the AFI circuit, allowing for determination of a worst-case scenario for chip failure based on the degradation of the AFI circuit, and preventing catastrophic failure of a larger system incorporating the chip.

Figure 1:
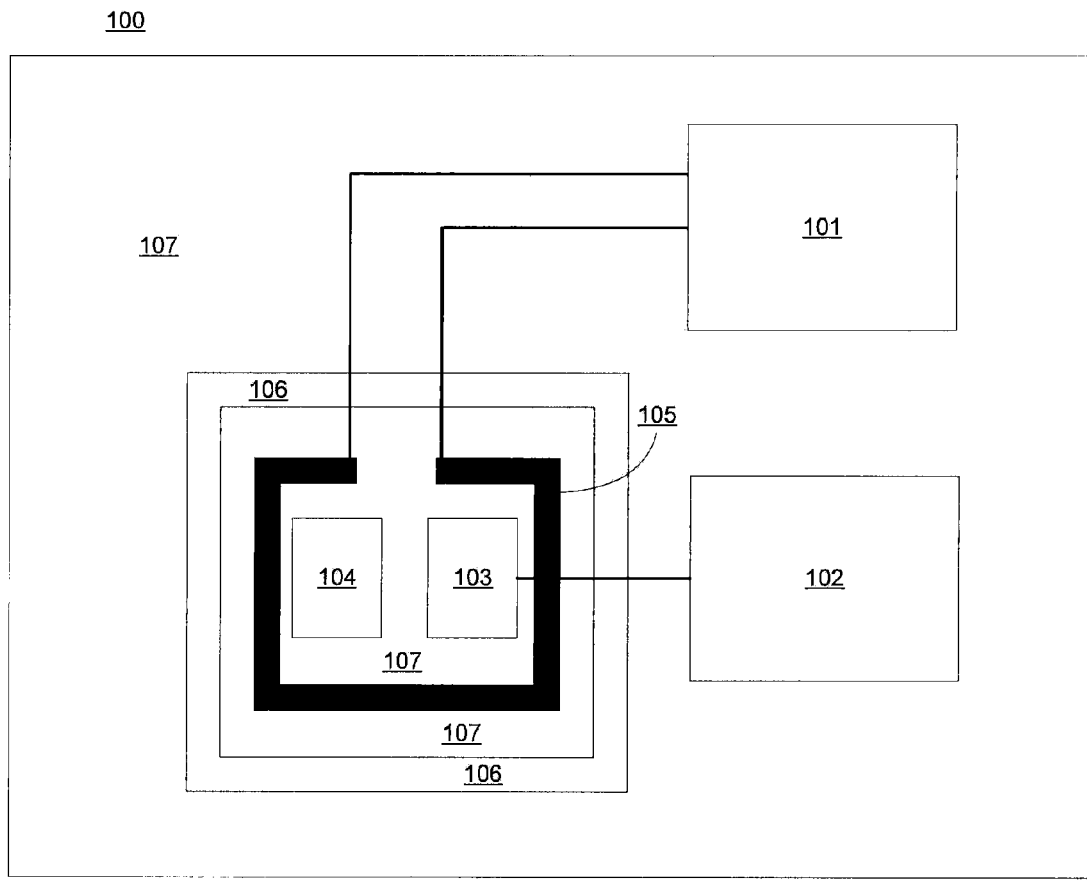
FIG. 1 illustrates a top view of an embodiment of an accelerated failure indicator (AFI).

FIG. 1 illustrates a top view of an embodiment of an AFI 100. AFI 100 is embedded in silicon substrate 107, which is part of a semiconductor chip. The AFI 100 comprises a heater 101 that is connected to a heating element 105. The heating element 105 heats circuit 103 and degradation of circuit 103 is monitored by reliability sensor 102. In some embodiments, heating element 105 heats circuit 103 to a temperature that is about 5° C. to 10° C. higher than an operating temperature of critical circuitry in the semiconductor chip. Thermal isolation region 106 protects the semiconductor chip from the heat generated by heating element 105, and may comprise a shallow-trench-isolation (STI) region. Thermal isolation region 106 comprises a material having a thermal conductivity that is lower than the thermal conductivity of silicon substrate 107. In some embodiments, thermal isolation region 106 may comprise silicon oxide, which has a thermal conductivity of about 1.4 W/m*° C.; in comparison, silicon substrate 107 has a thermal conductivity of about 130 W/m*° C. In other embodiments, thermal isolation region 106 may be filled with air. Heating element 105 may comprise, but is not limited to, polysilicon resistor wires, diffusion resistor strips, or back-end-of-line (BEOL) TaN resistors. The temperature inside the region enclosed by thermal isolation 106 may be monitored by optional temperature sensor 104 in some embodiments; the temperature sensor may provide feedback to heater 101. Heater 101 and reliability monitor 102 are located outside of thermal isolation region 106, ensuring that that the performance of heater 101 and reliability monitor 102 are not impacted by the elevated temperature within thermal isolation region 106. Heater 101 may comprise a constant current source, inducing Joule heating in the heating element 105.

Circuit 103 may comprise any appropriate circuit components, including but not limited to metal interconnects or MOSFET devices; the circuit components that comprise circuit 103 may mimic any critical or power-hungry devices in the semiconductor chip. The bias condition of the components of circuit 103 may be identical to the bias condition of components in the semiconductor chip, so an extra power supply is not needed. Various characteristics of circuit 103 may be monitored by reliability monitor 102 to determine degradation in circuit 103. Characteristics of circuit 103 that may be monitored by reliability monitor 102 to determine degradation include but are not limited to electromigration (EM) or resistance of metal interconnects, leakage current, or threshold voltage or bias-temperature-instability (BTI) of MOSFET devices. Degradation may occur at a higher rate in circuit 103 than in the semiconductor chip due to the elevated temperature inside thermal isolation region 106. An alarm may be triggered by reliability monitor 102 when the degradation of circuit 103 exceeds a predetermined threshold, so as to enable redundancy or flag the semiconductor chip for repair or replacement.

Figure 2:
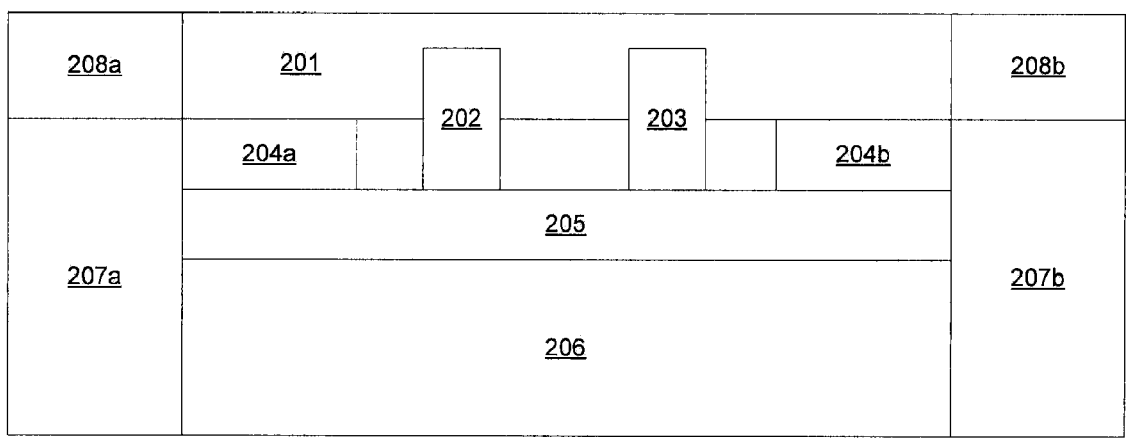
FIG. 2 illustrates a cross section of an embodiment of an AFI.

FIG. 2 illustrates a cross section of an embodiment of an AFI 200. AFI 200 is embedded on silicon substrate 206, which is part of a semiconductor chip (not shown), and comprises heating element 204a and 204a surrounding circuit 203. Thermal isolation region 207a and 207b protects the semiconductor chip from the heat produced by heating element 204a and 204b. Thermal isolation region 207a and 207b may comprise oxide or air gaps in some embodiments. Regions 208a and 208b may comprise inter-level dielectrics (ILD), a polymer, or air gaps in some embodiments. Region 201 may comprise ILD in some embodiments. Optional buried oxide (BOX) layer 205 may isolate silicon substrate 206 from the heat produced by heating element 204a and 204b in some embodiments. Optional temperature sensor 202 may monitor the temperature inside AFI 200 in some embodiments.

Figure 3:
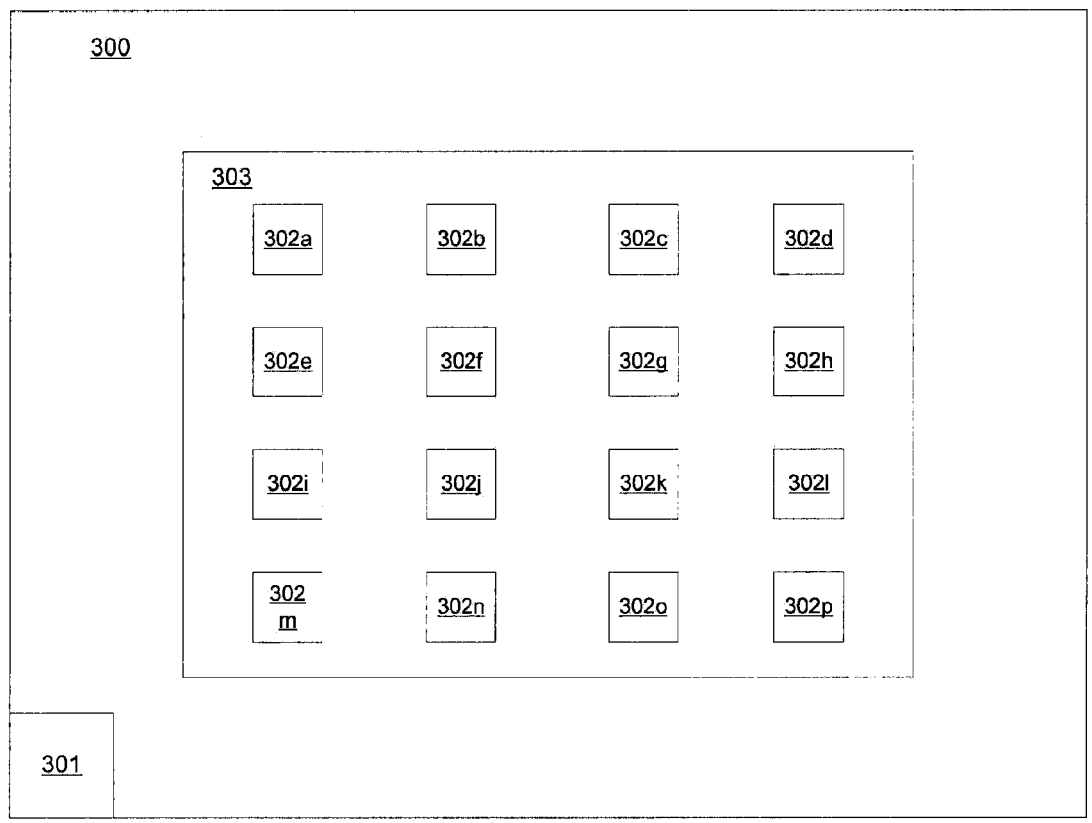
FIG. 3 illustrates an embodiment of a semiconductor chip comprising a plurality of temperature sensors and an AFI.

FIG. 3 illustrates an embodiment of a semiconductor chip 300 comprising a plurality of temperature sensors 302a-302p. Temperature sensors 302a-302p are shown for illustrative purposes only; a semiconductor chip 300 may comprise any appropriate number of temperature sensors. Temperature sensors 302a-302p are distributed over a critical circuitry area 303 of chip 300. AFI 301 receives temperature data from temperature sensors 302a-302p, and operates at a temperature higher than the highest temperature determined in critical circuitry area 303 by temperature sensors 302a-302p. AFI 301 comprises a circuit that may mimic circuitry in critical circuitry area 303; the AFI circuit is monitored for degradation.

Figure 4:
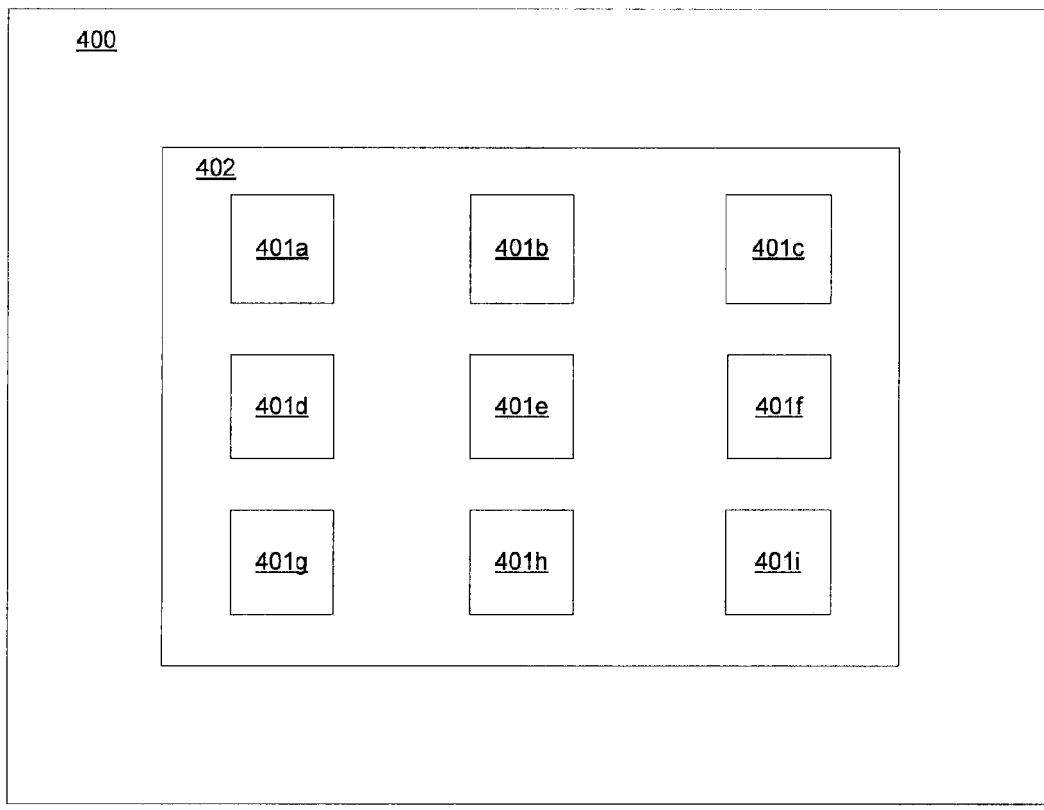
FIG. 4 illustrates an embodiment of a semiconductor chip comprising a plurality of AFIs.

FIG. 4 illustrates an embodiment of a semiconductor chip 400 comprising a plurality of AFIs 401a-401i. AFIs 401a-401i are shown for illustrative purposes only; semiconductor chip 400 may comprise any appropriate number of AFIs. AFIs 401a-401i are distributed over critical circuitry area 402 of semiconductor chip 400 to capture the highest temperature within critical circuitry area 402. AFIs 401a-401i operate at a temperature higher than the highest temperature present in critical circuitry area 402. AFIs 401a-401i comprise a respective plurality of circuits that may mimic circuitry in critical circuitry area 402; the plurality of circuits in AFIs 401a-401i are monitored for degradation.

Figure 5:
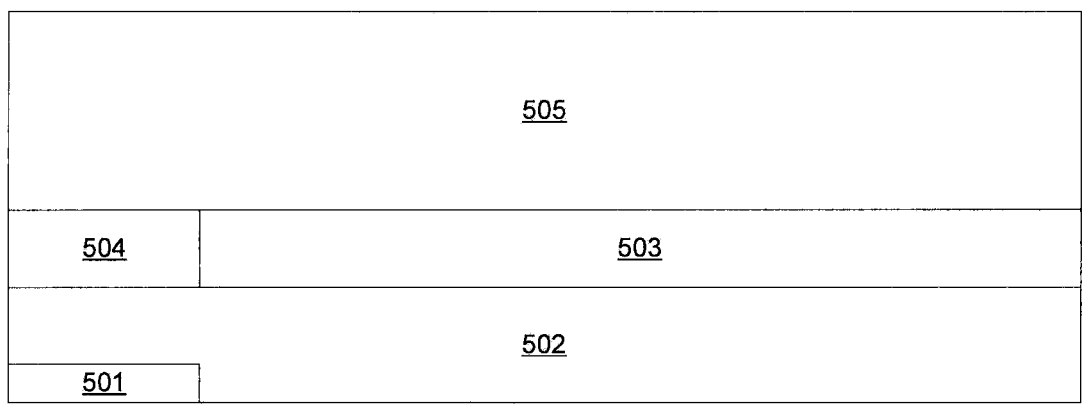
FIG. 5 illustrates a cross section of an embodiment of an electronics package comprising an AFI.
Figure 6:
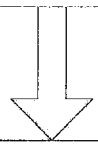
FIG. 6 illustrates an embodiment of a method of operating an AFI.
Figure 6:
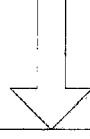
Figure 6:
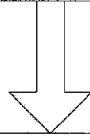

FIG. 5 illustrates an embodiment of an electronics package 500 comprising an AFI 501. Heat spreader 505 dissipates heat generated by semiconductor chip 502 via thermal conducting compound 503. AFI 501 is located on semiconductor chip 502. Thermal conducting compound 503 is removed from void region 504 above AFI 501, allowing for improved thermal isolation of AFI 501. AFI 501 is shown for illustrative purposes only, and it may be placed at any location in semiconductor chip 502. Embodiments of semiconductor chip 502 may comprise any appropriate number of AFIs FIG. 6 illustrates en embodiment of a method 600 of operating an AFI. In block 601, an operating temperature of critical circuitry in a semiconductor chip is determined. The operating temperature may be determined in real time. In block 602, a thermally insulated region inside the AFI is operated at a temperature higher than the determined operating temperature of the critical circuitry. The AFI operating temperature may be about 5° C. to 10° C. higher than the determined operating temperature in some embodiments. In block 603, a circuit located inside the thermally insulated region of the AFI is monitored for degradation. The circuit may mimic the critical circuitry of the semiconductor chip. In block 604, when the degradation of the circuit exceeds a predetermined threshold, an alarm is triggered, allowing the semiconductor chip to be flagged for repair or replacement before failure of the semiconductor chip occurs.

In an exemplary embodiment of an AFI, a 5° C. heat increase over the operating temperature of the semiconductor chip (from 100° C. to 105° C.) inside the thermally isolated region of an AFI may produce an acceleration factor of about 1.5 in electromigration of copper interconnects, and an acceleration factor of about 1.3 in electromigration of aluminum interconnects. Negative bias temperature instability (NBTI) in PMOSFET devices may be accelerated by an acceleration factor of about 1.1. Higher degradation acceleration may be obtained by raising the heat increase inside the AFI.

The technical effects and benefits of exemplary embodiments include prevention of catastrophic failure of electrical systems comprising semiconductor chips.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An accelerated failure indicator embedded on a semiconductor chip, comprising:
   an insulating region;
   a circuit located inside the insulating region;
   a temperature sensor located outside of the insulating region on the semiconductor chip, the temperature sensor configured to determine an operating temperature of circuitry located outside of the insulating region on the semiconductor chip;

a heating element located inside the insulating region, the heating element configured to heat the circuit to a temperature higher than the operating temperature of the circuitry located outside of the insulating region on the semiconductor chip; and
a reliability monitor configured to monitor the circuit for degradation, and further configured to trigger an alarm in the event that the degradation of the circuit exceeds a predetermined threshold.

2. The accelerated failure indicator of claim 1, wherein the insulating region comprises one of oxide and an air gap.

3. The accelerated failure indicator of claim 1, wherein the heating element is controlled by a heater located outside of the insulating region, and wherein the heater receives feedback from a temperature sensor located inside the insulating region.

4. The accelerated failure indicator of claim 1, wherein the heating element is configured to heat the circuit to a temperature that is about 5° C. to about 10° C. higher than the operating temperature of the circuitry located outside of the insulating region on the semiconductor chip.

5. The accelerated failure indicator of claim 1, wherein the reliability monitor is located outside the insulating region.

6. The accelerated failure indicator of claim 5, wherein the reliability monitor monitors one of electromigration (EM), resistance of metal interconnects, leakage current, and bias-temperature-instability (BTI) in the circuit.

7. The accelerated failure indicator of claim 1, wherein the heating element surrounds the circuit in the accelerated failure indicator.

8. The accelerated failure indicator of claim 1, wherein the semiconductor chip comprises a plurality of temperature sensors located outside of the insulating region on the semiconductor chip, and wherein the operating temperature comprises a highest temperature of a plurality of temperatures received from the plurality of temperature sensors located outside of the insulating region on the semiconductor chip.

9. A method of operating an accelerated failure indicator embedded on a semiconductor chip, the method comprising:
determining an operating temperature of circuitry located outside of an insulating region, the insulating region comprising the accelerated failure indicator, on the semiconductor chip;
heating a circuit located inside the insulating region of the accelerated failure indicator to a temperature higher than the determined operating temperature of the circuitry located outside of the insulating region;
monitoring the heated circuit for degradation; and
triggering an alarm in the event that the degradation of the heated circuit exceeds a predetermined threshold.

10. The method of claim 9, wherein the insulating region comprises one of oxide and an air gap.

11. The method of claim 9, further comprising controlling the heating of the circuit by a heater located outside of the insulating region, and wherein the heater receives feedback from a temperature sensor located inside the insulating region.

12. The method of claim 9, further comprising heating the circuit to a temperature that is about 5° C. to about 10° C. higher than the operating temperature of the circuitry located outside of the insulating region on the semiconductor chip.

13. The method of claim 9, wherein the circuit is monitored by a reliability monitor located outside the insulating region.

14. The method of claim 13, wherein the reliability monitor monitors one of electromigration (EM), resistance of metal interconnects, leakage current, and bias-temperature-instability (BTI) in the circuit.

15. The method of claim 9, further comprising flagging the semiconductor chip for repair or replacement in the event the alarm is triggered.

16. The method of claim 9, wherein the heating element surrounds the circuit in the accelerated failure indicator.

17. The method of claim 9, wherein the semiconductor chip comprises a plurality of temperature sensors located outside of the insulating region on the semiconductor chip, and wherein the operating temperature comprises a highest temperature of a plurality of temperatures received from the plurality of temperature sensors located outside of the insulating region on the semiconductor chip.

18. An electronics package comprising a semiconductor chip comprising an accelerated failure indicator, comprising:
the accelerated failure indicator, the accelerated failure indicator being located on a first surface of the semiconductor chip, wherein the accelerated failure indicator comprises:
an insulating region;
a circuit located inside the insulating region;
a heating element located inside the insulating region, the heating element configured to heat the circuit to a temperature higher than an operating temperature of the semiconductor chip; and
a reliability monitor configured to monitor the circuit for degradation, and further configured to trigger an alarm in the event that the degradation of the circuit exceeds a predetermined threshold;
a heat spreader, the heat spreader being connected to the semiconductor chip via a heat conducting compound, wherein the heat conducting compound is located on a second surface of the semiconductor chip, the second surface of the semiconductor chip being located on an opposite side of the semiconductor chip from the first surface of the semiconductor chip; and
a void in the heat conducting compound located in an area on the second surface of the semiconductor chip opposite the location of the accelerated failure indicator on the first surface of the semiconductor chip.

19. The electronics package of claim 18, wherein the semiconductor chip comprises a plurality of accelerated failure indicators, the plurality of accelerated failure indicators being located adjacent to critical circuitry in the semiconductor chip.

20. The electronics package of claim 18, wherein the heating element is configured to heat the circuit to a temperature that is about 5° C. to about 10° C. higher than the operating temperature of circuitry located outside of the insulating region on the semiconductor chip.

* * * * *